(12) United States Patent
Ozeki et al.

(10) Patent No.: US 6,281,546 B1
(45) Date of Patent: *Aug. 28, 2001

(54) INSULATED GATE FIELD EFFECT TRANSISTOR AND MANUFACTURING METHOD OF THE SAME

(75) Inventors: Yoshihiko Ozeki, Kariya; Naoto Okabe, Chita-gun; Naohito Kato, Kariya, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,405

(22) Filed: Dec. 18, 1997

(30) Foreign Application Priority Data

Feb. 17, 1997 (JP) ..................................... 9-032265

(51) Int. Cl.$^7$ ........................... H01L 29/76; H01L 29/94; H01L 31/062; H01L 31/113; H01L 31/119
(52) U.S. Cl. ........................... 257/329; 257/142; 257/144
(58) Field of Search ..................................... 257/329, 334, 257/337, 368, 370, 372, 378, 142, 144

(56) References Cited

U.S. PATENT DOCUMENTS

4,672,407 * 6/1987 Nahagawa et al. .................. 257/142
4,801,986   1/1989 Chang et al. .

FOREIGN PATENT DOCUMENTS

35 19 389 A1  12/1985 (DE) .
   217 266    4/1987 (EP) .
661 755 A1   7/1995 (EP) .

* cited by examiner

Primary Examiner—Sara Crane
Assistant Examiner—Thien F. Tran
(74) Attorney, Agent, or Firm—Pillsbury Winthrop LLP

(57) ABSTRACT

A wide high concentration P$^+$ type region is formed on the surface of an N$^-$ type epitaxial layer formed on a P type substrate in the vicinity of the edge portion of a cell region in which a transistor device is formed. As a result, holes generated at the outside of the cell region mostly flow through the P$^+$ type region and reach to an emitter electrode. Therefore, the flow amount of the holes does not concentrate on a channel P well for forming a channel region of the transistor device at the cell edge portion, whereby a ruggedness against a latch-up phenomenon can be improved.

26 Claims, 14 Drawing Sheets

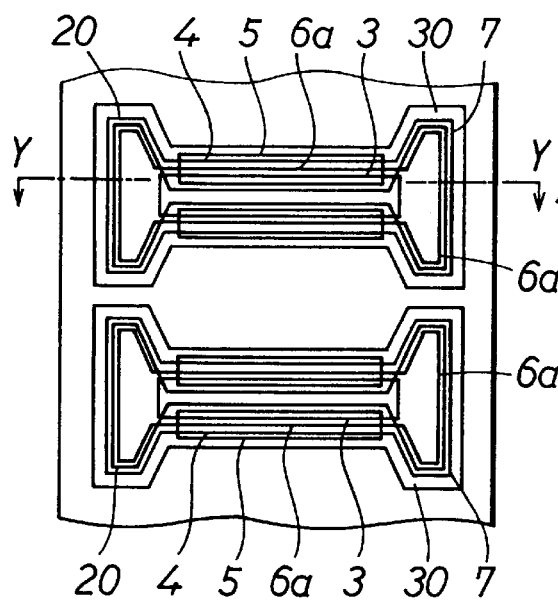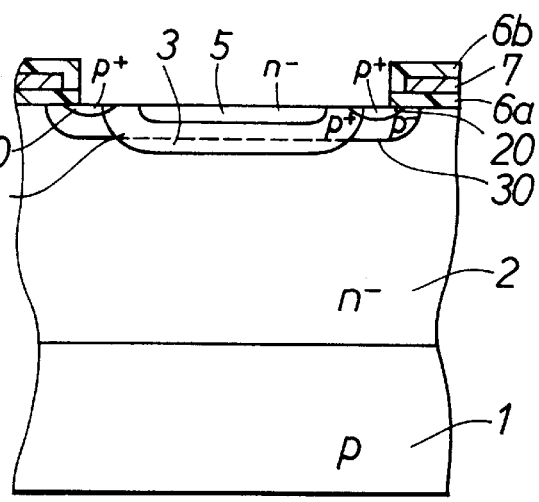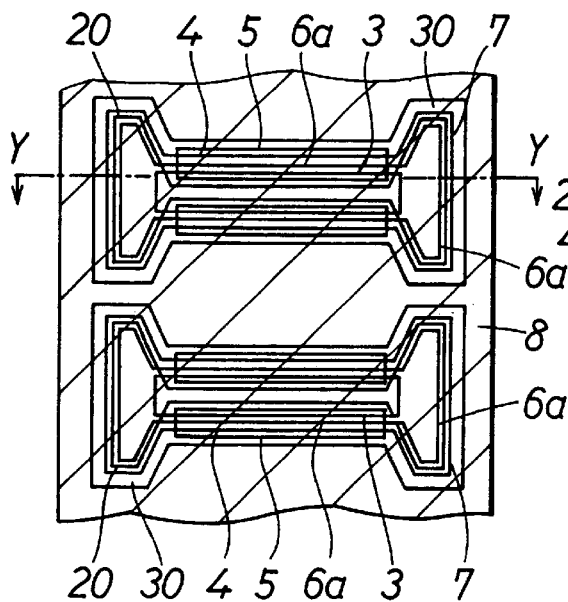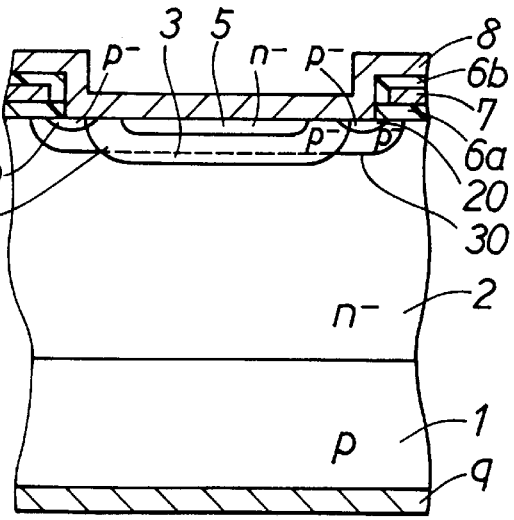

INSULATED GATE FIELD EFFECT TRANSISTOR AND MANUFACTURING METHOD OF THE SAME

CROSS REFERENCE TO RELATED APPLICATION

This application is based upon and claims the benefit of priority of Japanese Patent Application No. 9-32265filed on Feb. 17, 1997, the contents of which are incorporated herein by reference.

BACKGROUND OF THE INVENTION

1. Field of the Invention:

The present invention relates to an insulated gate field effect transistor having a DMOS structure and utilized as a power switching device which can withstand high voltage and allow large current to flow, and to a manufacturing method of the same. Such an insulated gate field effect transistor is suitably used for a vehicle ignition apparatus and a motor driving inverter.

2. Discussion of Related Art:

It is known that an insulated gate bipolar transistor ("IGBT")enables high withstand voltage compatible with low ON resistance. Although the IGBT has a similar structure to a power MOSFET, the IGBT has a layer of an opposite electrical conductivity type from a source layer as a drain region.

FIG. 19A shows a top schematic view of the main part of an unit cell of the IGBT and FIG. 19B shows a sectional view of the IGBT taken along a line 19B—19B in FIG. 19A. The structure of the IGBT will be explained below based on FIGS. 19A and 19B. What an $N^-$ type epitaxial layer 2 is grown on the surface of a $P^+$ type substrate 1 is used as a substrate of the IGBT. Then, a deep $P^+$ type diffusion layer (a "deep P well") 3 of which concentration is relatively high and a P type diffusion layer (a "channel P well") 4 of which concentration is lower than that of the deep P well 3 are formed in the surface of the $N^-$ type epitaxial layer 2.

An emitter region 5 composed of an $N^+$ type diffusion layer (corresponding to a source region of a power MOSFET) is formed in the surfaces of the deep P well 3 and the channel P well 4. Further, a gate electrode 7 is provided on the channel P well 4 with a gate oxide film 6a interposed. The gate electrode 7 is formed to have a pattern indicated by the hatched portion in FIG. 19A. The gate electrode 7 is covered by an interlayer insulating film 6b. A contact hole (a part surrounded by a dotted line in FIG. 19A) is formed through the gate oxide film 6a and the interlayer insulating film 6b. An emitter electrode 8 is disposed to contact the emitter region via this contact hole. A collector electrode 9 is disposed on the back of the $P^+$ type substrate.

FIG. 20 is a partially sectional view of the IGBT to describe the operation thereof when the IGBT thus constructed is actually operated. The operation of the IGBT will be explained based on FIG. 20.

When a certain threshold voltage is applied to the gate electrode 7, the surface of the channel P well 4 below the gate electrode 7 is inverted, thus creating an electron channel. Then, electrons flow into the $N^-$ type epitaxial layer 2 through this channel. The electrons which have flown into the $N^-$ type epitaxial layer 2 drop the potential of the $N^-$ type epitaxial layer 2 so as to forwardly bias the PN junction between the $P^+$ type substrate 1 and the $N^-$ type epitaxial layer 2. As a result, holes which are a minority carrier flow from the $P^+$ type substrate 1 to the $N^-$ type epitaxial layer 2.

Due to the flow of the holes, the $N^-$ type epitaxial layer 2 is subjected to modulation of the electrical conductivity, thereby considerably reducing its resistivity. As a result, a large hole current flows from the collector electrode 9 to the emitter electrode 8.

Because the horizontal resistance of the channel P well 4 (the part indicated by a mark of resistance in FIG. 20) is large, a large voltage drop occurs in the channel P well 4. When the internal resistance of the channel P well 4 is taken into account, the electrical connection in the IGBT may be expressed by a circuit diagram as shown in FIG. 21.

That is, an FET shown in FIG. 21 is composed of the gate electrode 7, the channel P well 4, the emitter region 5 and the $N^-$ type epitaxial layer 2, a PNP transistor is composed of the P type substrate 1, the $N^-$ type epitaxial layer 2, and the channel P well 4 and the deep P well 3, and an NPN transistor (a "parasitic transistor") is composed of the emitter region 5, the channel P well 4 and the $N^-$ type epitaxial layer 2. A resistance R denotes the internal resistance of the channel P well 4.

When the quantity of the hole current flowing through the resistance R increases as shown in FIG. 21, the large voltage drop occurs at the resistance R. Then, when this voltage drop reaches a value which can forwardly bias the PN junction of the emitter region 5 and the channel P well 4, the parasitic transistor turns on. Thereby, a so-called latch-up phenomenon occurs, by which the IGBT is kept continuously conductive state.

FIG. 22 shows the state of the flow of the holes in the IGBT on the top surface of a wafer. Most of the holes injected from the $P^+$ type substrate 1 to the $N^-$ type epitaxial layer 2 flow upward in the $N^-$ type epitaxial layer 2 and reach the emitter electrode 8 passing through the channel P well 4 which is located at the upper part thereof. However, the holes injected to the $N^-$ type epitaxial layer 2 at the periphery of a cell region in which the current flows via the channel flow heading toward the nearby cell region and reach the emitter electrode 8 because no cell region is formed thereabove. Because the flows of holes from the periphery are thus concentrated at the edge portion of the cell region as a result, its density becomes higher than that of the hole current flowing through the inner part of the cell region. That is, the flow rate of the holes increases in the vicinity of the edge portion of the cell region. Therefore, there has been a problem that the voltage drop due to the horizontal resistance of the channel P well 4 in the vicinity of the cell edge portion becomes large and the abovementioned latch-up phenomenon readily occurs.

The present invention is intended to solve the aforementioned problem and its object is to improve the ruggedness against the latch-up phenomenon by relieving the concentration of the holes at the cell region in the vicinity of the cell edge portion.

SUMMARY OF THE INVENTION

In order to achieve the aforementioned object, according to the present invention, in addition to a first region which is formed in the cell region and transmits hole current to a emitter electrode as the deep well, a second region having a high concentration is formed at the outside of the cell region so that its width is made wider than the first region to overlap with all or a part of the channel well. As a result, the flows of holes at the cell edge portion are drawn to the second region by forming the high concentration, i.e. low resistant, second region at the outside of the cell region. Therefore, the holes do not go around from the cell edge portion into the first region of the cell region but flow via the second region. Thereby, the flow rate of the holes will not increase in the cell region in the vicinity of the cell edge portion due to the holes flowing from the cell edge portion. Accordingly, it becomes possible to prevent the increase of the voltage drop in the cell region in the vicinity of the cell edge portion and to improve the ruggedness against the latch-up phenomenon.

The second region may be formed to be linked with another second region formed for the adjacent cell region. The holes coming from the outside of the cell region may be drawn almost completely into the second region by thus connecting the adjacent second regions to each other. Thereby, the ruggedness against the latch-up phenomenon may be improved further.

It is noted that the concentration of the second region is not limited to only a concentration equal to that of the first region. That is, the second region may have the same concentration as the first region or the second region may have a concentration higher than that of the first region.

The second region can be formed together with the first region by. using a mask having an opening at the region where the first region and the second region are to be formed. As a result, a step required for forming only the second region may be eliminated and a number of steps for manufacturing the semiconductor device according to the present invention may be reduced by forming the first region together with the second region in the same time by one mask as described above.

BRIEF DESCRIPTION OF DRAWINGS

These and other objects, features and characteristics of the present invention will be appreciated from a study of the following detailed description, the appended claims, and drawings, all of which form a part of this application. In the drawings:

FIGS. 12A through 18B are views showing a manufacturing process of the IGBT in FIG. 11;

DETAILED DESCRIPTION OF PREFERRED EMBODIMENT

Figure 1:
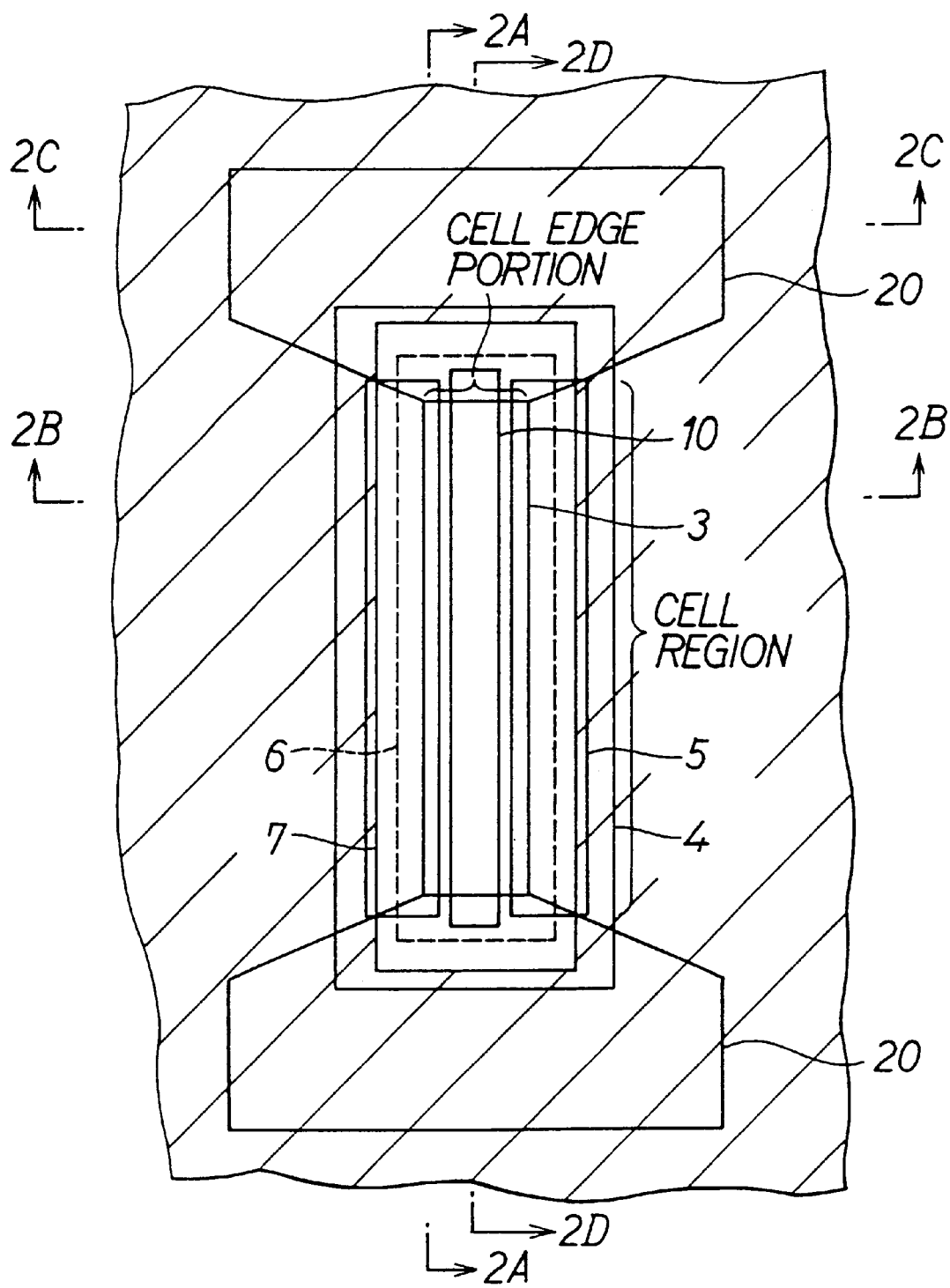
FIG. 1 is a schematic top view of an IGBT unit cell according to a first embodiment.

The present invention will be explained below based on the preferred embodiments shown in the drawings.

FIRST EMBODIMENT

Figure 2A:
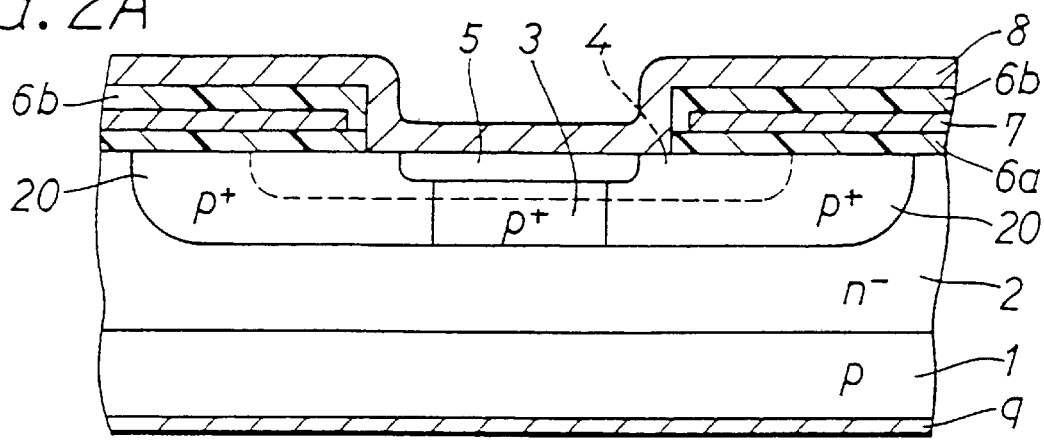
FIG. 2A is a sectional view taken along a line 2A—2A in FIG. 1.
Figure 2D:
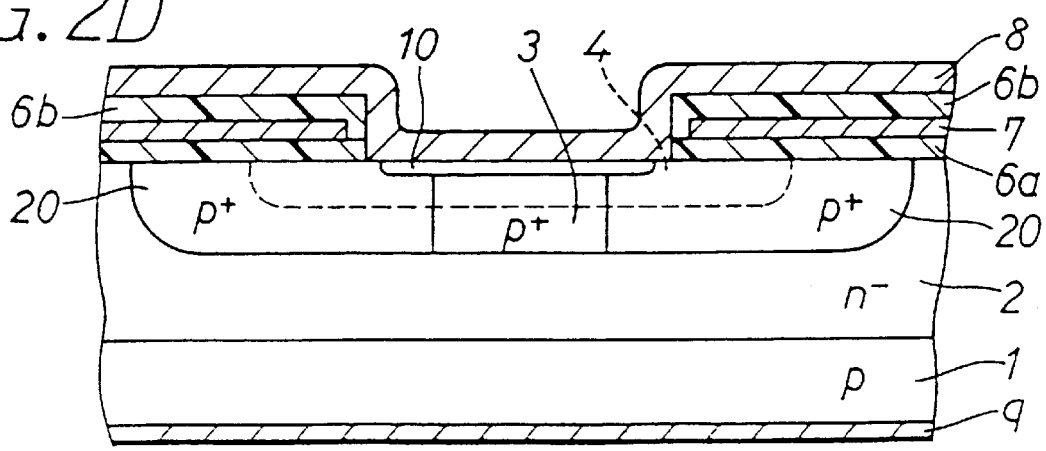
FIG 2D is a sectional view taken along a line 2D—2D in FIG. 1.
Figure 2B:
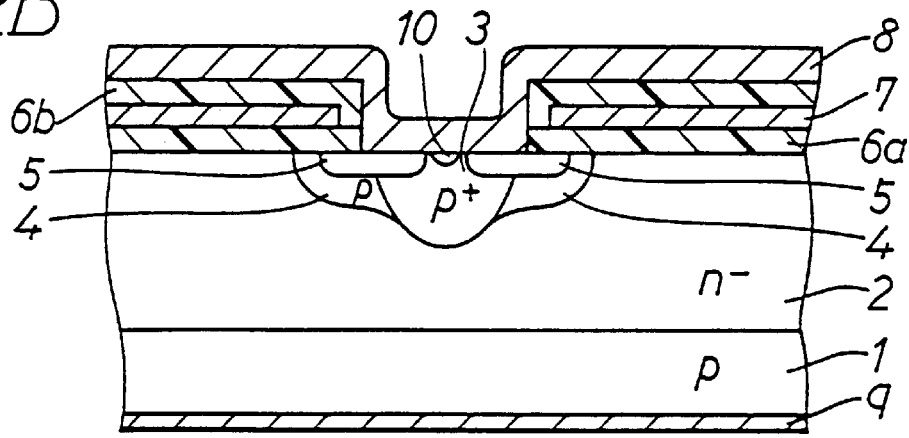
FIG. 2B is a sectional view taken along a line 2B—2B in FIG. 1.
Figure 2C:
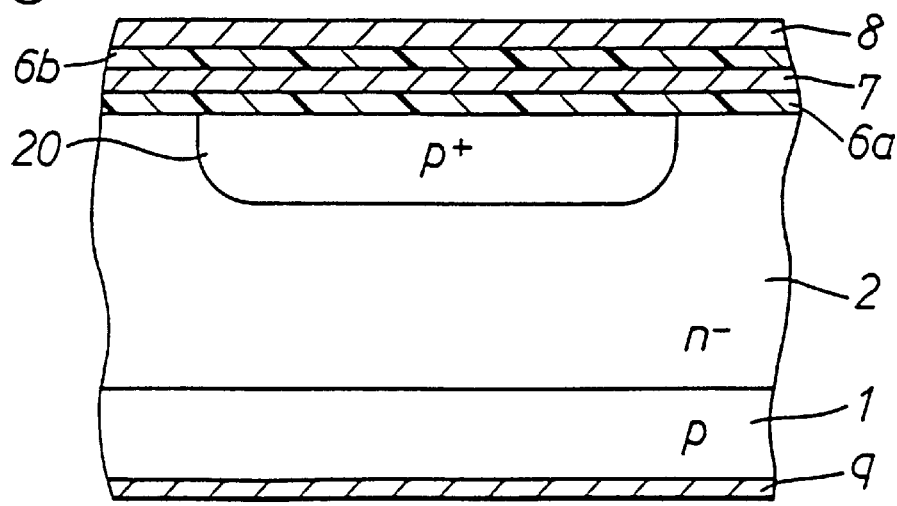
FIG. 2C is a sectional view taken along a line 2C—2C in FIG. 1.

An IGBT is composed of a plurality of unit cells provided in parallel. FIG. 1 is a schematic top view of the unit cell. FIGS. 2A through 2C are sectional views taken along lines 2A—2A, 2B—2B and 2C—2C in FIG. 1, respectively. The structure of the IGBT will be explained below based on FIGS. 1 and 2A–2C.

What an $N^-$ type epitaxial layer 2 has grown on the As surface of a P type substrate 1 is used as a substrate of the IGBT. A rectangular patterned deep P well 3 whose concentration is relatively high is formed on the surface of the $N^-$ type epitaxial layer 2. Further, a high concentration $P^+$ type region 10 for lowering the resistance of the deep P well 3 is formed on the surface of the deep P well 3. Further, a channel P well 4 whose concentration is lower and whose configuration is wider and shallower than those of the deep P well 3 is disposed so as to interpose the deep P well 3 at the center thereof.

$P^+$ type regions 20, having a concentration higher, a depth deeper and a width wider than those of the channel P well 4, are formed in the vicinity of cell edge portions while being connected to the edge of the deep P well 3 in its longitudinal direction (cell edge portion) to improve the ruggedness against the latch-up phenomenon. Specifically, the $P^+$ type regions 20 are formed approximately into a shape which diverges from the cell edge portion with a predetermined angle. It is noted that although the $P^+$ type region 20 is shown separately from the deep P well 3 in FIG. 1 in order to clarify their roles, actually they are formed by the $P^+$ type layer having the same concentration in the present embodiment.

Further, an emitter region 5 composed of an $N^+$ type diffusion layer is formed on the deep P well 3 and the channel P well 4. A gate electrode 7 is disposed above the channel P well 4 and provided commonly for the respective unit cells, interposing a gate oxide film 6a therebetween. The gate electrode 7 is covered further by an interlayer insulating film 6b. The gate electrode 7 is patterned into a shape indicated by the hatched portion in FIG. 1. A contact hole is formed in the interlayer insulating film 6b. An emitter electrode 8 is formed to contact the deep P well 3 and the emitter regions 5 through this contact hole as a contact window. A collector electrode 9 is formed on the back of the P type substrate 1.

When a certain voltage is applied to the gate electrode 7 in the IGBT thus constructed, holes (current) flow from the collector electrode 9 to the emitter electrode 8 as described before. At this time, holes injected outside a cell region are drawn to the cell edge portion due to the flow of the holes in the cell region. As a result, a flow of holes is generated at the cell edge portion.

Figure 3:
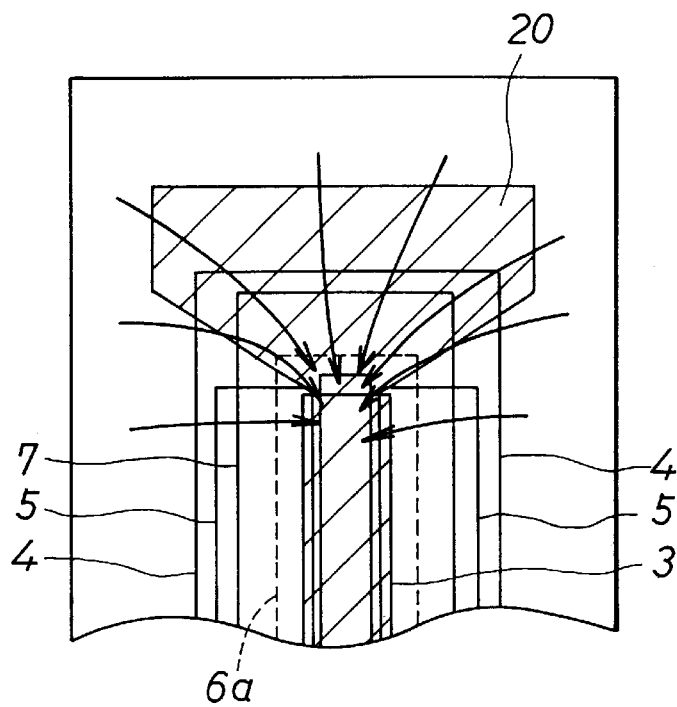
FIG. 3 is a schematic view showing flows of holes in the IGBT.

However, because the $P^+$ type region 20 having a low resistance and a large width is formed in the vicinity of the cell edge portion, the flow of holes at the cell edge portion are mostly drawn into the $P^+$ type region 20. FIG. 3 shows the flows of holes at the cell edge portion. The holes reach the emitter electrode 8 while flowing through the $P^+$ type region 20 as shown in FIG. 3 without going around from the cell edge portion to the channel P well 4 having a higher resistance in the cell region because the resistance of the $P^+$ type region 20 (slanting line part in FIG. 3) at the cell edge portion is low. Especially, because the $P^+$ type region 20 is electrically connected to the deep P well 3 having a low resistance, the holes injected in the vicinity of the cell edge portion can reach the emitter electrode 8 only through the $P^+$ type region 20 and the deep P well 3. Therefore, the voltage drop at the channel P well 4 is not increased due to the hole current flowing in the vicinity of the cell region.

In this way, the flow rate of the holes in the cell region in the vicinity of the cell edge portion will not increase due to the holes flowing from the cell edge portion. Therefore, the voltage drop will not increase at the cell region in the vicinity of the cell edge portion and the ruggedness against the latch-up phenomenon is improved as a result. In other words, the voltage drop in the cell region in the vicinity of the cell edge portion can be suppressed and the ruggedness against the latch-up phenomenon can be improved by forming the low resistant and wide $P^+$ type region 20 in the vicinity of the cell edge portion.

FIGS. 4A through 10B schematically show a manufacturing process for manufacturing the IGBT thus constructed. It is noted that FIGS. 4A through 10A are schematic top views of the IGBT and FIGS. 4B through 10B are sectional views taken along a line X—X in FIGS. 4A through 10A. The manufacturing process for manufacturing the IGBT will be explained below based on FIGS. 4A through 10B.

Figure 4A:
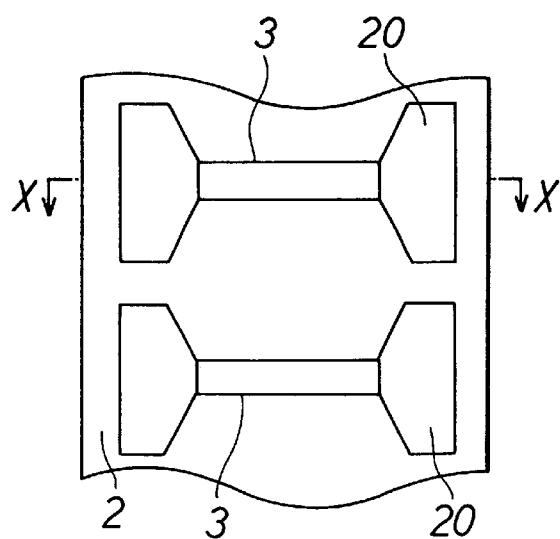
FIGS. 4A through 10B are views showing a manufacturing process of the IGBT in FIG. 1.
Figure 4B:
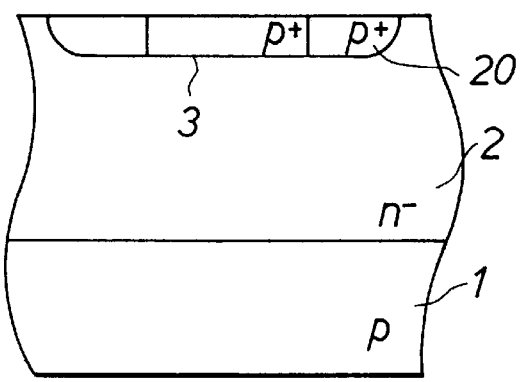

Step shown in FIGS. 4A and 4B

At first, the $N^-$ type epitaxial layer 2 is grown on the P type substrate 1. Then, it is used as the substrate. Next, a photoresist having an opening pattern at the region where the deep P well 3 and the $P^+$ type region 20 are to be formed is formed on the upper surface of the $N^-$ type epitaxial layer 2 by photolithography. Then, the deep P well 3 and the $P^+$ type region 20 are formed selectively by implanting boron ions using the photoresist as a mask.

At this time, the $P^+$ type region 20 is formed such that it is connected with the edge of the deep P well 3 and such that it has a concentration higher (resistance lower) and a width wider than those of the channel P well 4 to be formed in the later step. It is noted that a step required only for forming the $P^+$ type region 20 may be eliminated by forming the $P^+$ type region 20 together with the deep P well 3.

Figure 5A:
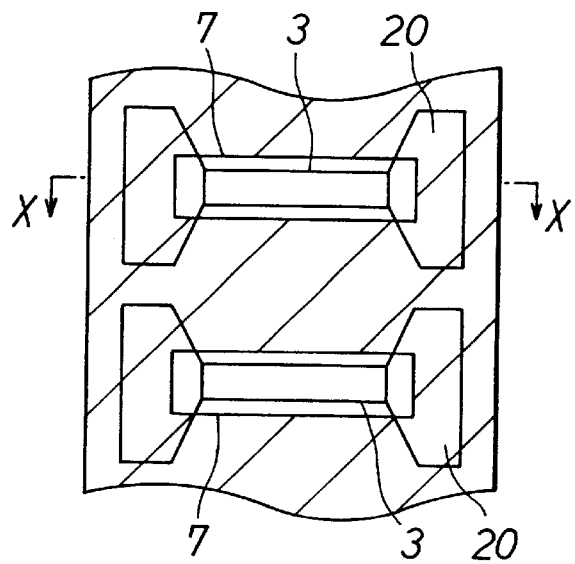
Figure 5B:
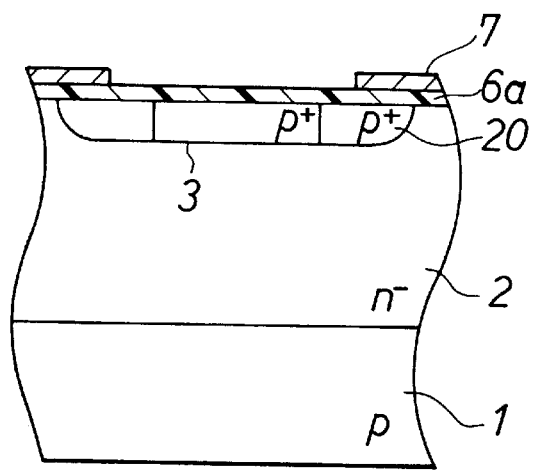

Step shown in FIGS. 5A and 5B

Next, the surface of the $N^-$ type epitaxial layer 2 is oxidized to form the gate oxide film 6a. Then, poly-silicon doped in high concentration is deposited on the gate oxide film 6a to form the gate electrode 7 having a plurality of rectangular hollow patterns. At this time, the $P^+$ type region 20 is located under the gate electrode 7 as shown in FIGS. 5A and 5B. It is noted that the gate electrode 7 when the wafer is viewed from the top is indicated by slanting lines in FIG. 5A.

Figure 6A:
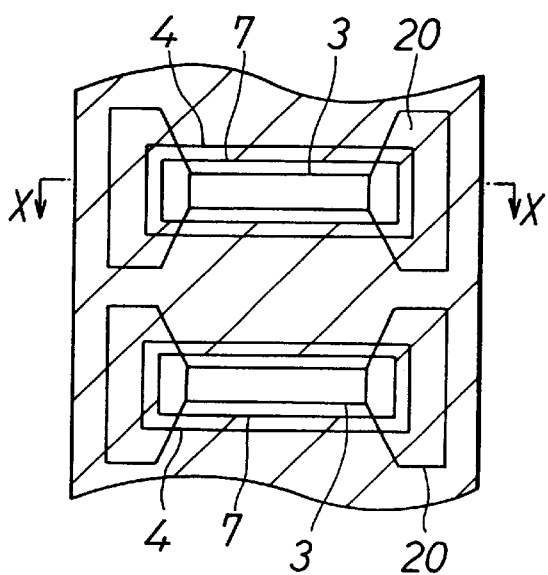
Figure 6B:
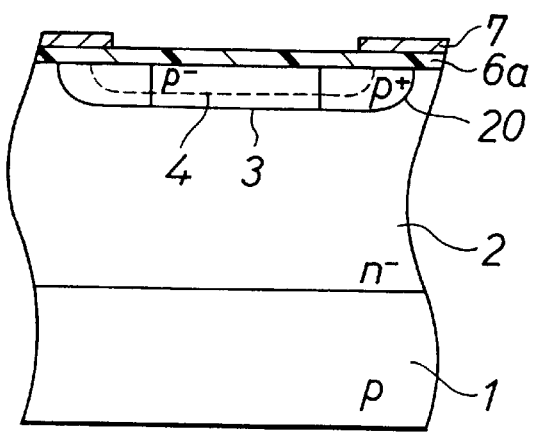

Step shown in FIGS. 6A and 6B

After that, the channel P well 4 is formed by implanting boron ions using the gate electrode 7 as a mask and by diffusing the boron ions. It is noted that because the rectangular hollow pattern of the gate electrode has a width wider than the opening pattern of the photoresist used for forming the deep P well 3, the channel P well 4 is formed at both sides of the deep P well 3 as shown in FIG. 2B. Further, the channel P well 4 is formed shallower than the deep P well 3 by adjusting the energy for implanting boron ions. Thereby, the channel P well 4 is aligned with the gate electrode 7 as shown in a schematic plan view in FIG. 6A.

Figure 7A:
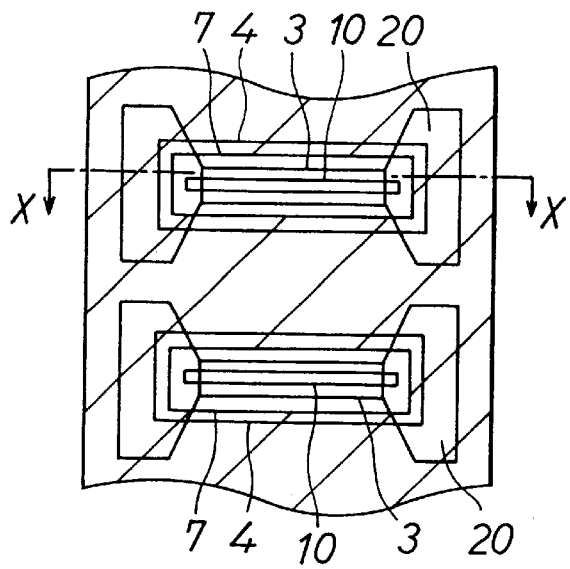
Figure 7B:
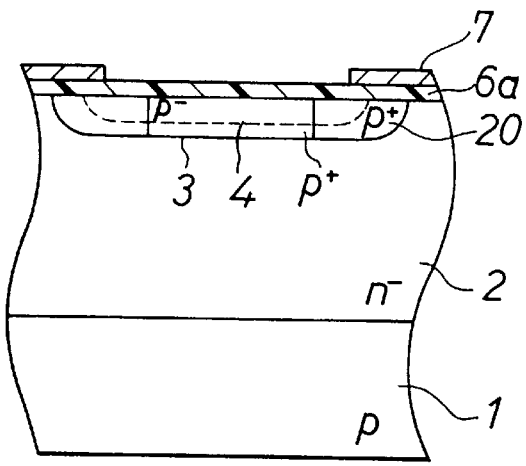

Step shown in FIGS. 7A and 7B

Then, the photoresist having an opening pattern at the region where the high concentration $P^+$ type region 10 is to be formed is formed by photolithography. Boron ions are implanted using this photoresist as a mask. Then, the boron ions are diffused to form the high concentration $P^+$ type region 10 for lowering the resistance of the deep P well 3. It is noted that the opening pattern of the photoresist for forming the high concentration $P^+$ type region 10 is positioned at the center of the deep P well 3 and has a width narrower than that of the deep P well 3. Therefore, the high concentration $P^+$ type region 10 is formed at the center of the deep P well 3 to make contact with the emitter electrode 8.

Figure 8A:
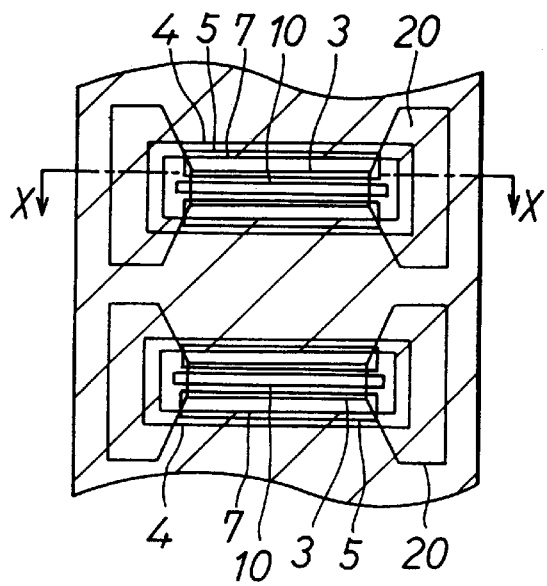
Figure 8B:
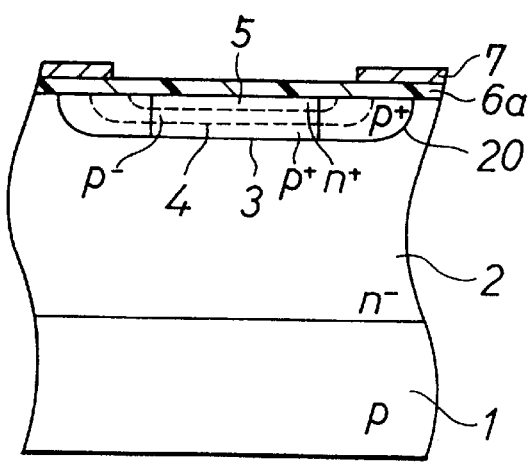

Step shown in FIGS. 8A and 8B

Next, a photoresist having an opening pattern at the region where the emitter region 5 is to be formed is formed by photolithography. The emitter region 5 is formed so that one end portion thereof makes contact with the emitter electrode 8 and the channel P well 4 remains between the other end portion thereof and the $N^-$ type epitaxial layer 2. Phosphorus or arsenic ions are implanted using the photoresist as a mask. Then, these implanted ions are diffused to form the emitter region 5 composed of the $N^+$ type diffusion layer.

Figure 9A:
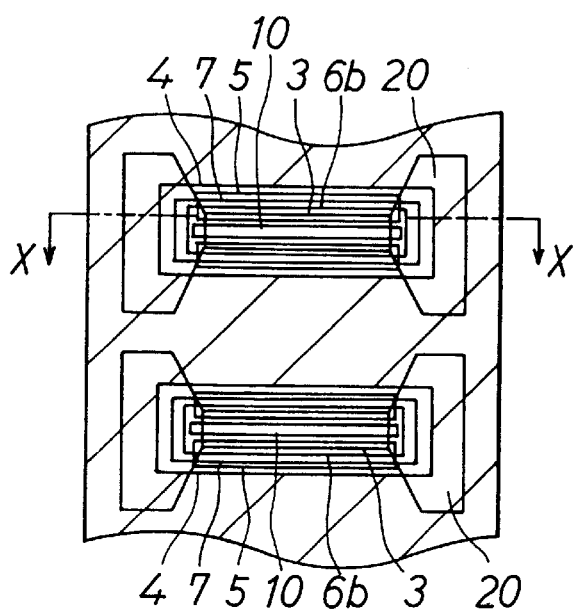
Figure 9B:
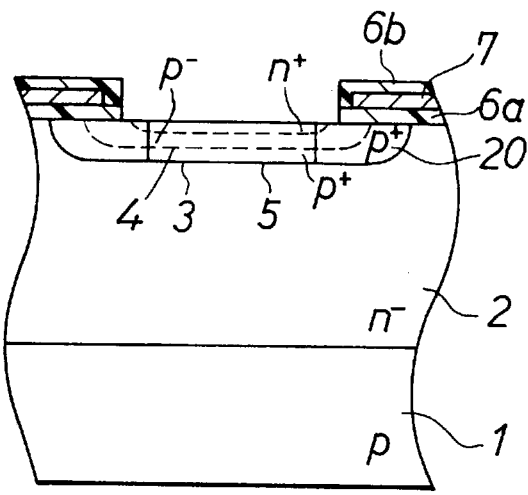

Step shown in FIGS. 9A and 9B

Then, after forming the interlayer insulating film 6b on the whole surface of the wafer, a contact hole for obtaining an ohmic contact with the emitter region 5 and the channel P well 4 (via the high concentration $P^+$ type region 10 and the deep P well 3) is formed selectively in the interlayer insulating film 6b and the gate oxide film 6a formed before.

Figure 10A:
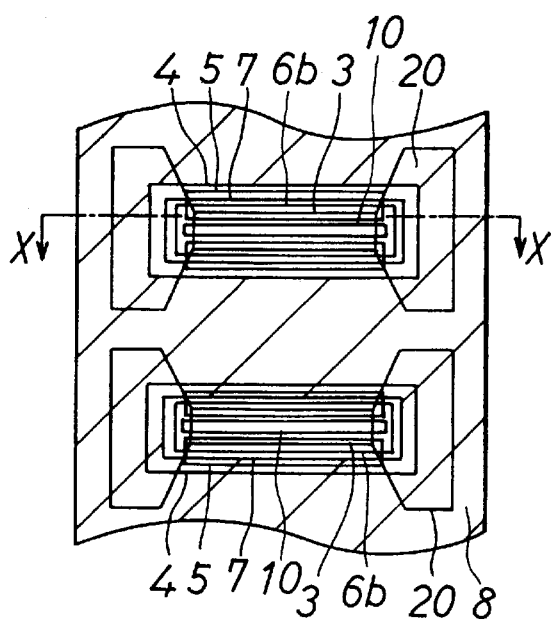
Figure 10B:
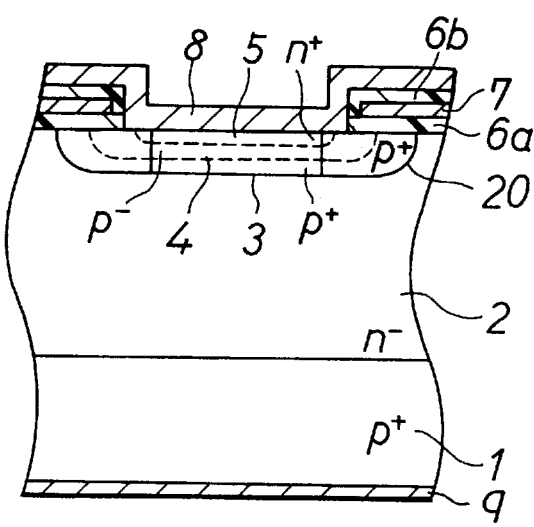

Step shown in FIGS. 10A and 10B

After that, a metal film of several microns is deposited by sputtering to form the emitter electrode 8. Then, a metal film is deposited by an evaporation or spattering on the back of the P type substrate 1 to form the collector electrode 9. Thereby, the IGBT is completed.

It is noted that while the $P^+$ type region 20 has been formed together with the deep P well 3 as described above, the $P^+$ type region 20 may be formed separately from the deep P well 3. Further, although the $P^+$ type region 20 has been formed approximately into the shape of a home base in the present embodiment, the same effect may be obtained when it is formed into a shape wider than the width of the channel P wells 4 (or wider than the opening width of the rectangular hollow pattern of the gate electrode). For instance, it may be formed approximately into a circular or rectangular shape. However, when the $P^+$ type region 20 is formed so as to cross the emitter region 5, there may be a case when the voltage drop increases at the region where it crosses. Therefore, it is preferable to form the $P^+$ type region 20 so that the part where it crosses the emitter region 5 is less.

SECOND EMBODIMENT

Figure 11:
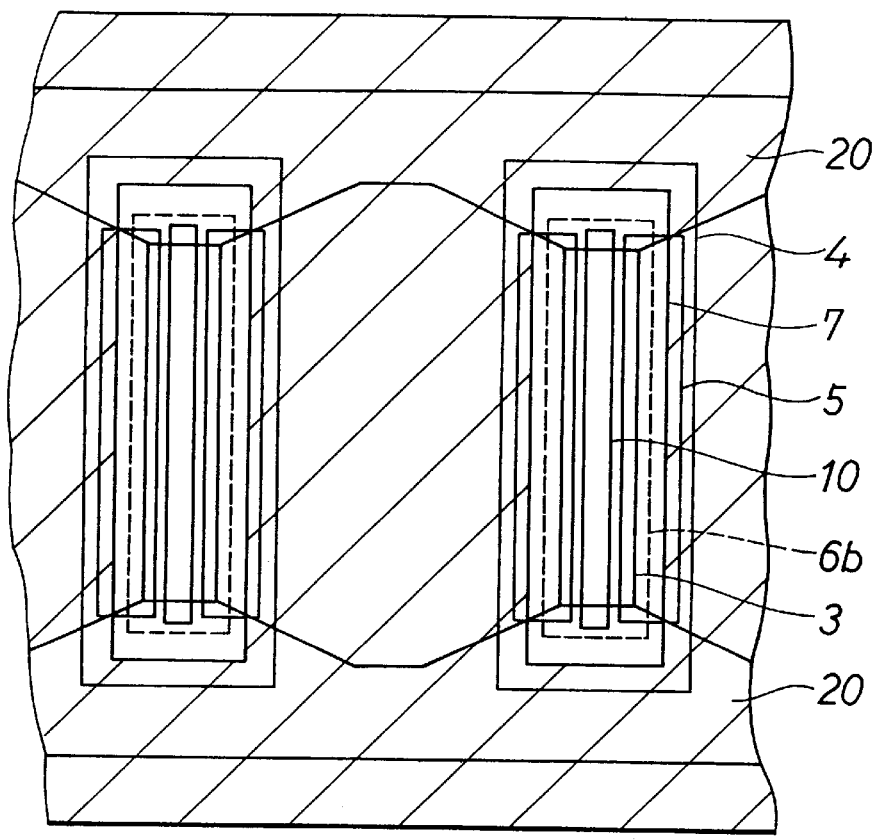
FIG. 11 is a schematic top view of an IGBT according to a second embodiment.

FIG. 11 is a schematic view of the IGBT of the second embodiment. It is noted that because the basic structure of the IGBT is almost the same as that of the first embodiment, only the part which is different from the first embodiment will be explained below.

While the second embodiment is the same as the first embodiment in that the $P^+$ type region 20 whose concentration is higher and whose width is wider than the channel P well 4 is formed at the edge portion of the deep P well 3 formed in each unit cell, it is different from the first embodiment in that the $P^+$ type regions 20 are linked to each other in the neighboring unit cells. That is, the cell region is completely separated from the outside thereof by linking the P+ type regions 20 to each other in the neighboring unit cells in the second embodiment.

The second embodiment allows the flows of holes from the outside of the cell region to be almost completely drawn into the P+ type region 20. As a result, it can be more perfectly prevented that the holes at the cell edge portion flow into the channel P well 4 of the cell region in the vicinity of the cell edge portion. In other words, the second embodiment allows the flow rate of the holes to be lessened at the cell edge portion and the ruggedness against the latch-up phenomenon to be improved.

It is noted that although the manufacturing steps of the present embodiment are the same as those in the first embodiment, the mask used in the step shown in FIGS. 4A and 4B must be changed to what conforms to the P+ type region 20 shown in FIG. 11 because the shape of the P+ type region 20 is different from that of the first embodiment.

THIRD EMBODIMENT

FIGS. 12A through 18B schematically show steps for manufacturing the IGBT of the third embodiment. The manufacturing process of the IGBT of the third embodiment is different from the first embodiment mainly in that although the P+ type region 20 has been formed before forming the gate electrode 7 to improve the ruggedness against the latch-up phenomenon in the first embodiment, the P+ type region 20 is formed after forming the gate electrode 7 in the third embodiment. It is noted that FIGS. 12A through 18A are schematic top views of the IGBT and FIGS. 12B through 18B are sectional views taken along lines Y—Y in FIGS. 12A through 18A. The steps for manufacturing the IGBT will be explained below based on FIGS. 12A through 18B.

Figure 12A:
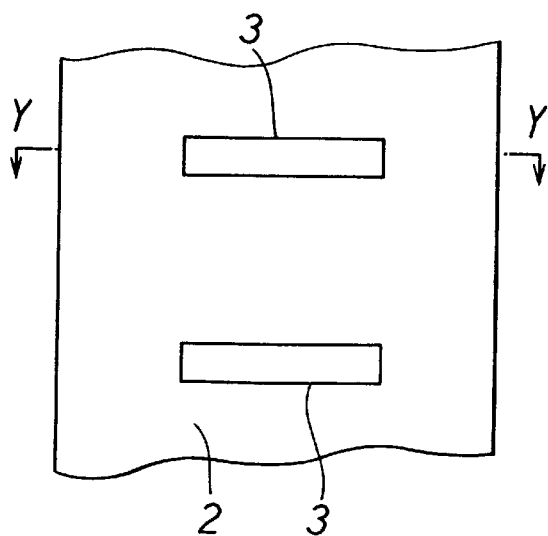
Figure 12B:
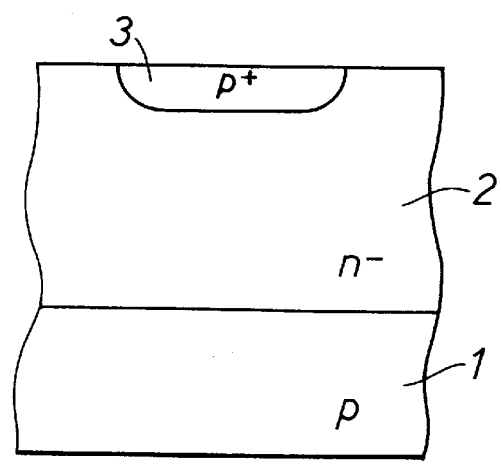

Step shown in FIGS. 12A and 12B

At first, the substrate in which the N− type epitaxial layer 2 has been grown on the P type substrate 1 is prepared. Then, a photoresist having an opening pattern at the region, where the deep P well 3 is to be formed, is formed on the upper surface of the N type epitaxial layer 2. The deep P well 3 is formed selectively by implanting boron ions using the photoresist as a mask.

Figure 13A:
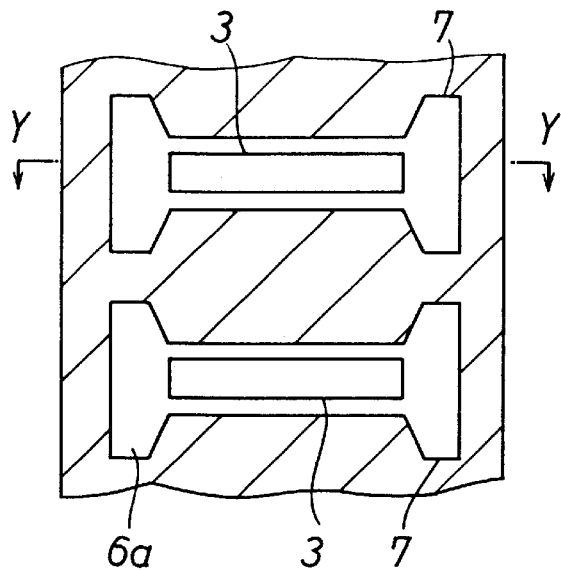
Figure 13B:
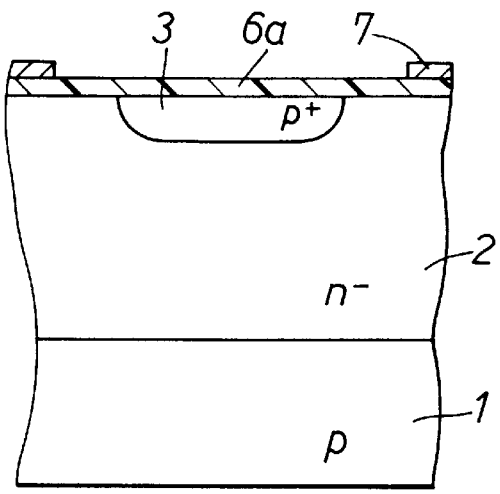

Step shown in FIGS. 13A and 13B

Next, the surface of the N− type epitaxial layer 2 is oxidized to form the gate oxide film 6a. Then, poly-silicon doped in high concentration is deposited on the gate oxide film 6a to form the gate electrode 7 having a nearly I-shaped hollow pattern (shape in which edges in the longitudinal direction of a rectangular shape are widened).

Figure 14A:
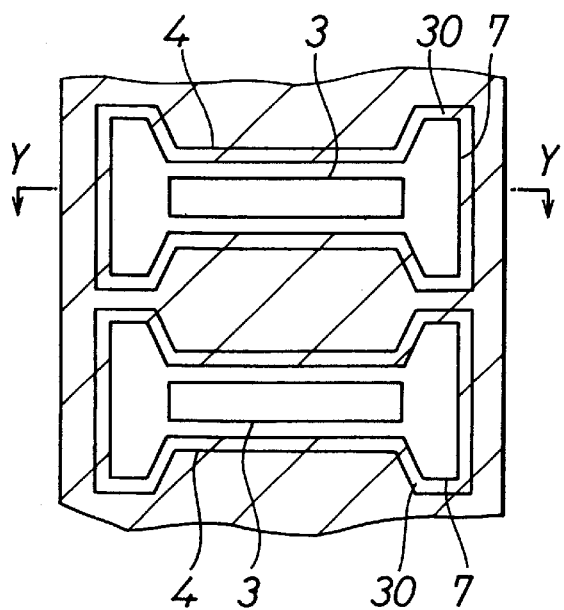
Figure 14B:
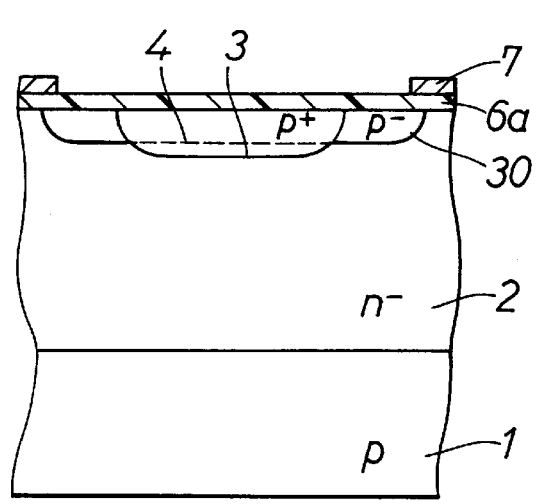

Step shown in FIGS. 14A and 14B

After that, the channel P well 4 and a peripheral region 30 are formed by implanting boron ions using the gate electrode 7 as a mask and by diffusion. It is noted that the peripheral region 30 is formed because the shape of the gate electrode 7 has been selected so as to be able to form the P+ type region 20 in the later steps. The peripheral region 30 has nothing to do with the role of the channel P well 4.

Figure 15A:
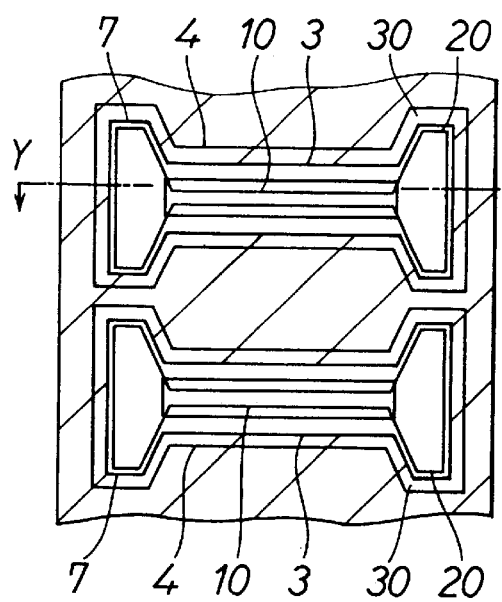
Figure 15B:
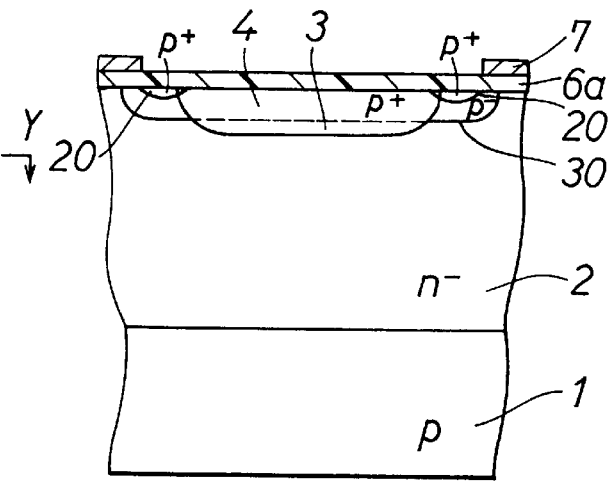

Step shown in FIGS. 15A and 15B

Then, a photoresist having an opening pattern at the region where the P+ type region 20 is to be formed and at a part of the deep P well 3 is formed by photolithography. Boron ions are implanted using this photoresist as a mask. Then, the boron ion are diffused to form the high concentration P+ type region 20. The concentration of the part of the deep P well 3 is increased to form the high concentration P+ type region 10. It is noted that the P+ type region 20 continues to the high concentration P+ type region 10. When the IGBT is actually operated, the positive holes drawn into the P+ type region 20 flow to the emitter electrode 8 via this high concentration P+ type region 10.

Figure 16A:
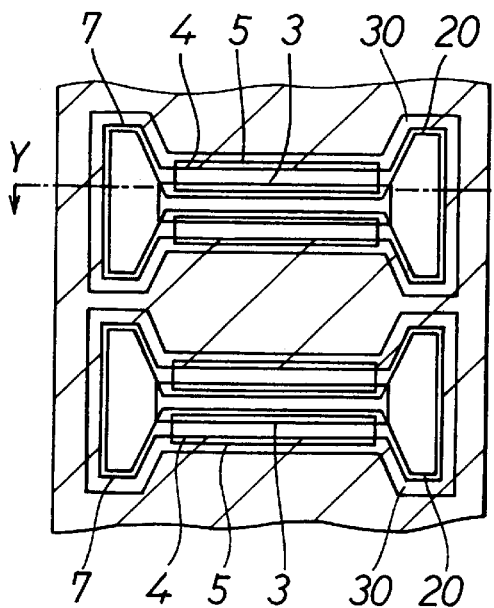
Figure 16B:
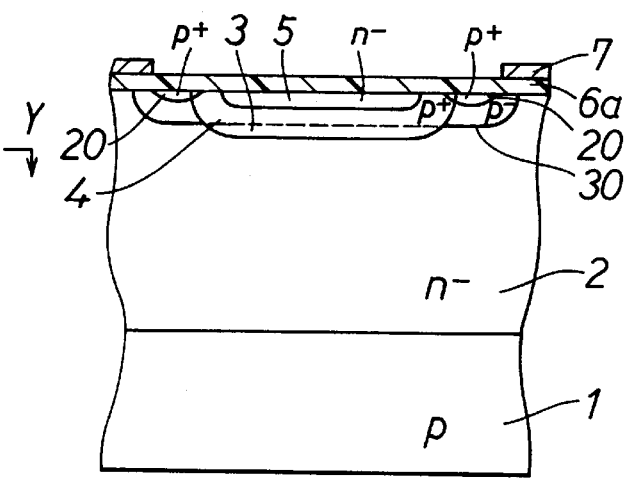
Figure 19A:
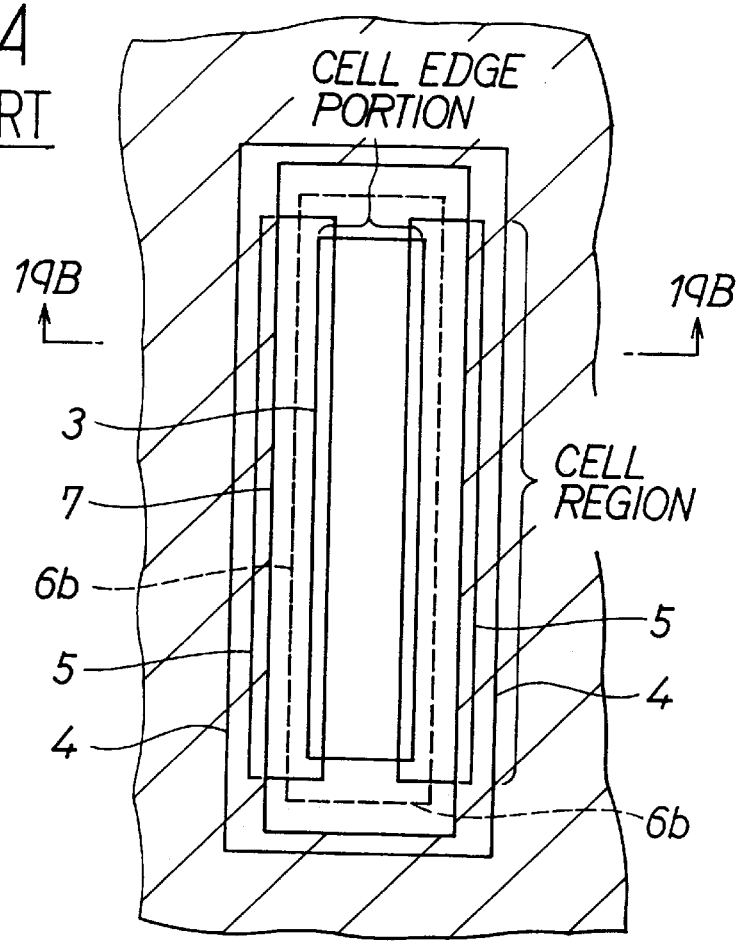
FIG. 19A is a schematic top view of a conventional IGBT and FIG. 19B is a sectional view taken along a line 19B—19B in FIG. 19A.
Figure 19B:
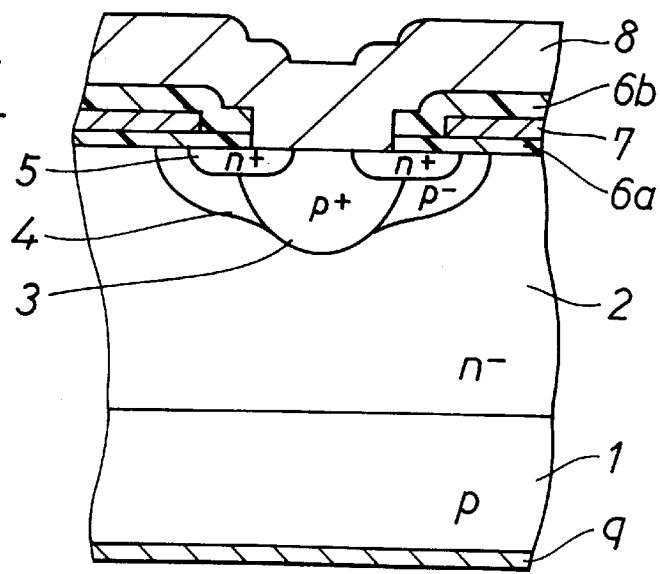
Figure 20:
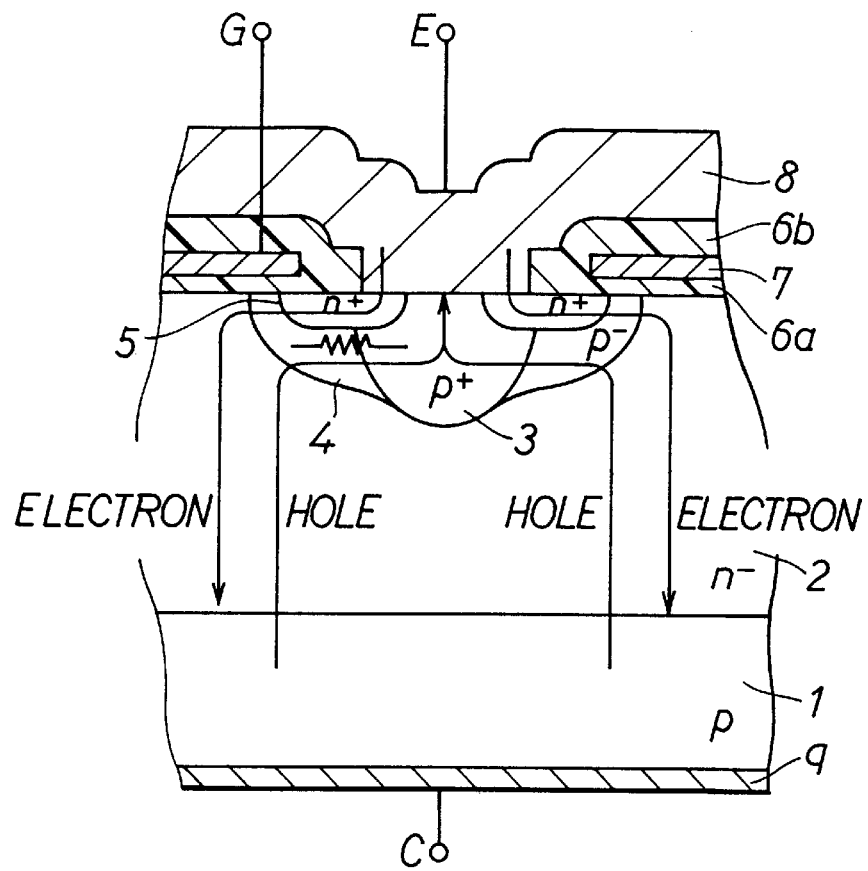
FIG. 20 is a sectional view to describe an operation of the IGBT shown in FIGS. 19A and 19B.
Figure 21:
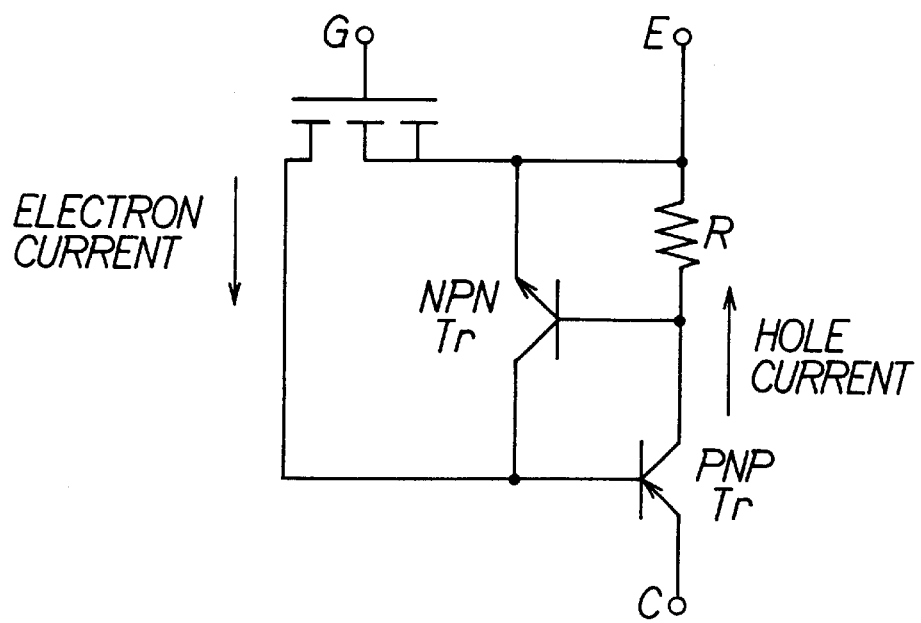
FIG. 21 is a circuit diagram showing an electrical connection in the IGBT shown in FIGS. 19A and 19B.
Figure 22:
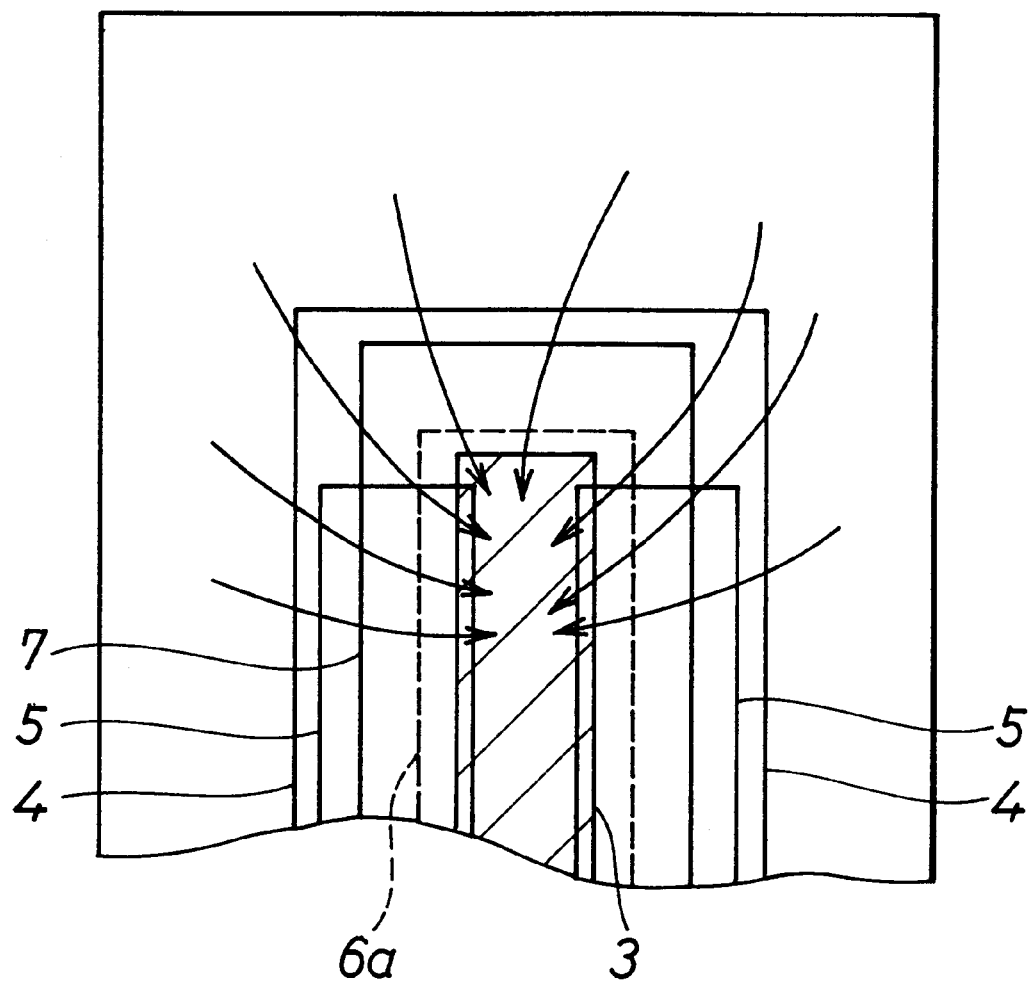
FIG. 22 is a schematic top view showing flows of holes in the IGBT shown in FIGS. 19A and 19B.

Step shown in FIGS. 16A and 16B

Next, a photoresist having an opening pattern at the region where the emitter region 5 is to be formed is formed by photolithography. Phosphorus or arsenic ions are implanted using the photoresist as a mask. Then, the implanted ions are diffused to form the emitter region 5 composed of the N+ type diffusion layer.

Step shown in FIGS. 17A and 17B

Then, after forming the interlayer insulating film 6b on the whole surface of the wafer, a contact hole for obtaining an ohmic contact with the emitter region 5, the channel P well 4 and a P+ type region 10 is formed selectively in the interlayer insulating film 6b and the gate oxide film 6a. It is noted that because the P+ type region 20 is formed after forming the gate electrode 7, the gate electrode 7 is not formed above the P+ type region 20. Therefore, the ohmic contact is made also in the P+ type region 20 by removing the interlayer insulating film 6b and the gate oxide film 6a above the P+ type region 20.

Step shown in FIGS. 18A and 18B

After that, a metal film of several microns is deposited by sputtering to form the emitter electrode 8. Then, a metal film is deposited by evaporation or spattering on the back of the P type substrate 1 to form the collector electrode 9. Thereby, the IGBT is completed.

Thus, the P+ type region 20 may be formed independently from the deep P well 3. Because the P+ type region 20 is formed in the separate steps from the deep P well 3, the concentration of the P+ type region 20 may be enhanced without depending on the concentration of the deep P well 3. When the concentration of the P+ type region is enhanced, this P+ type region facilitates the holes to be drawn therethrough.

FOURTH EMBODIMENT

Next, a modification of the third embodiment will be described.

Although the rectangular deep P well 3 is formed in the step shown in FIGS. 12A and 12B in the third embodiment, the I-shaped deep P well composed of a rectangular portion i-lo and a width-spreading portion extending from the edges of the rectangular portion may be formed instead. In this case, when the hollow pattern of the gate electrode is a nearly I-shaped pattern as shown in FIG. 13A, the high concentration P+ region having a higher impurity concentration can be obtained by overlapping with the above-described the width-spreading portion of the deep P well at the time of formation of the high concentration P+ region in a later manufacturing step.

The width-spreading portion of the deep P well can be formed to have a width wider than that of the channel P well of when the gate electrode has been disposed. For achieving this, the width of the width-spreading portion of the I-shaped hollow pattern of the gate electrode may be made narrower than that of the width-spreading portion of the deep P well.

According to this construction, because the P type region at the cell edge portion can be made higher in concentration than the case of the third embodiment, it is possible to facilitate drawing of holes.

OTHER EMBODIMENT

It is noted that although the present invention has been applied to the IGBT in the embodiments described above, it is applicable to a DMOS transistor, instead of the IGBT. For instance, when a DMOS transistor to which the present invention is applied breaks down, the P+ type region allows to suppress the density of current at the cell edge portion from increasing and to suppress the parasitic operation from occurring. Furthermore, the present invention is also applicable to an up-drain type DMOSFET or IGBT.

Further, in the above embodiments, examples having a planar type DMOS structure are disclosed. However, the present invention is also applicable to an example having a trench gate type DMOS structure.

Although preferred embodiments of the present invention has been described in detail, it is understood that the present invention is not limited to the specific embodiments but rather be construed broadly within its spirit and scope as set out in the accompanying claims.

What is claimed is:

1. An insulated gate field effect transistor comprising:
   a first semiconductor layer of a first conductivity type;
   a second semiconductor layer of a second conductivity type provided in a surface portion of the first semiconductor layer to define a cell region;
   a third semiconductor layer of the first conductivity type provided in a surface portion of the second semiconductor layer define a channel region in the second semiconductor layer between the first semiconductor layer and the third semiconductor layer;
   a gate electrode disposed on the channel region through an insulating film;
   an emitter electrode disposed in contact with the third semiconductor layer;
   a collector electrode for supplying a current toward the emitter electrode through the first semiconductor layer; and
   a high concentration layer of the second conductivity type disposed in the surface portion of the first semiconductor layer below the emitter electrode with a deeper depth and a higher impurity concentration than those of the second semiconductor layer, the high concentration layer including a first portion disposed within the cell region and a second portion connected to the first portion and extending away from the cell region with a width which increases as a distance from the cell region increases, the second portion being contacting the emitter electrode, wherein the first and second portions of the high concentration layer contacts at a portion deeper than the second semiconductor layer.

2. The insulated gate field effect transistor of claim 1, wherein:
   the first portion has an approximately rectangular shape with a side which has a first portion width; and
   the second portion is connected to the side of the first portion, and expands from the side of the first portion toward the outside of the cell region.

3. The insulated gate field effect transistor of claim 2, wherein the second portion width is wider a width of the cell region.

4. The insulated gate field effect transistor of claim 1, wherein the first portion contacts the emitter electrode.

5. The insulated gate field effect transistor of claim 4, the first portion includes a high concentration third portion having an impurity concentration higher than that of a remaining portion of the first portion, and contacts the emitter electrode at the high concentration third portion.

6. An insulated gate field effect transistor comprising:
   a first semiconductor layer of a first conductivity type;
   a second semiconductor layer of a second conductivity type provided in a surface portion of the first semiconductor layer to define a cell region; a third seimconductor layer having the first conductivity type provided in surface portion of the second semiconductor layer to define a channel region in the second semiconductor layer between the first semiconductor layer and the third semiconductor layer;
   a gate electrode disposed on the channel region through an insulating film;
   an emitter electrode disposed in contact with the third semiconductor layer;
   a collector electrode for supplying a current toward the enitter electrode through the first semiconductor layer;
   a high concentration first portion disposed in the surface portion of the first semiconductor layer within the cell region to have a higher impurity concentration and a deeper depth than those of the second semiconductor layer; and
   a high concentration second portion disposed in the surface portion of the first semiconducter layer to have a higher impurity concentration than that of the second semiconductor layer and to contact the second semiconductor layer and the emitter electrode, the high concentration second portion extending to an outside of the cell region whereby holes flow from the outside of the cell region into the emitter electrode through the high concentration second portion, wherein the high concentration second portion contacts the high concentration first portion at a portion deeper than the second semiconductor layer.

7. The insulated gate field effect transistor of claim 6, wherein the high concentration second portion is integrally connected to the high concentration first portion within the cell region to have a depth equal to that of the high concentration first portion.

8. The insulated gate field effect transistor of claim 7, wherein the high concentration second portion expands from the high concentration first portion toward the outside of the cell region.

9. the insulated gate field effect transistor of claim 8, wherein:
   the high concentration first portion has an approximately rectangular shape with a side which has a first portion width; and
   the high concentration second portion is connected to the side of the high concentration first portion, and has a second portion width which gradually increases from the high concentration first portion toward the outside of the cell region.

10. The insulated gate field effect transistor of claim 6, wherein the high concentration first portion and the high concentration second portion are integrally connected to each other under the emitter electrode.

11. The insulated gate field effect transistor of claim 6, wherein:
the insulating film has a rectangular contact hole in which the emitter electrode is disposed to contact both the third semiconductor layer and the high concentration second portion, the high concentration second portion contacting the emitter electrode at an edge portion of the contact hole.

12. A semiconductor device comprising:
a semiconductor substrate of a first conductivity type; and first and second transistor cells provided in the semiconductor substrate, each of the first and second transistor cells comprising:
a channel layer of a second conductivity type provided in the semiconductor substrate to define a cell region;
an emitter layer of the first semiconductor type provided in the semiconductor substrate to define a channel region in the channel layer between the emitter layer and rhe semiconductor substrate;
a gate electrode disposed above the channel region with an insulating film interposed therebetween,
an emitter electrode disposed in contact with the emitter layer;
a collector electrode for supplying a current to the emitter electrode through the semiconductor substrate; and
a high concentration portion of the second conductivity type having an impurity concentration higher than that of the channel layer and provided in the semiconductor substrate to contact the emitter electrode, the high concentration portion having a first portion provided within the cell region with a depth deeper than that of the channel layer and a second portion, the second portion contacting the first portion at a portion deeper than that of the channel layer and extending away from the cell region with a width which increases as a distance from the cell region increase,
wherein the high concentration portion of a first one of the first and second transistor cells is connected to the high corcentration portion of a second one of the first and second transistor cells at an outside of the cell region.

13. The semiconductor device of claim 12, wherein, in each of the first and second transitor cells, the second portion is connected to the first portion under the emitter electrode.

14. The semiconductor device of claim 12, wherein, in each of the first and second tranistor cells, the width of the second portion is wider than a width of the channel layer.

15. The semiconductor device of claim 12, wherein:
in each of the first and second transistor cells, the channel layer has a generally rectangular shape with a short side and a long side;
the emitter layer extends along the long side of the channel layer; and
the high concentration portion is connected to the short side of the channel layer.

16. A semiconductor device comprising:
a semiconductor substrate of a first conductivity type; and first and second transistor cells provided in the semiconductor substrate, each of the first and second transistor cels comprising:
a rectangular channel layer of a second conductivity type provided in the semiconductor substrate;
a rectangular emitter layer of the first conductivity type provided in the semiconductor substrate along a long side of the channel layer to define a channel region in the channel layer between the semiconductor substrate and a long side of the emmiter layer;
a gate electrode disposed above the channel region with an insulating film interposed therebetween;
an emitter electrode electrically connected to the emitter layer;
a collector electrode for supplying a collector current through the semiconductor substrate; and
a semiconductor layer of the second conductibity type provided in the semiconductor substrate to contact the emitter electrode and to be connected to a short side of the channel layer, the semiconductor layer having a first portion provided entirely under the emitter electrode and extending along the long side of the channel layer, and a second protion contacting the first portion at a portion deeper than the channel layer and extending from the short side with a width which increases as a distance from the short side is increased,
wherein the semiconductor layer of a first one of the first and second transistor cells is connected to the semiconductor layer of a second one of the first and second transistor cells.

17. The semiconductor device of claim 16, wherein the semiconductor layer of one of the first and second transistor cells has a width wider than that of the channel layer of the one of the first and second transistor cells.

18. The semiconductor device of claim 16, wherein the semiconductor layer has a higher impurity concentration and a deeper depth than those of the channel layer.

19. The semiconductor device of claim 16, wherein the width of the second portion is wider than that the channel layer.

20. A semiconductor device comprising:
a semiconductor substrate of a first conductivity type;
an insulating film disposed on the semiconductor substrate, the contact hole having an elongated shape extending in a specific direction;
a channel layer of a second conductivity type provided in the semiconductor substrate and having an elongate shape extending in parallel with the contact hole;
an emitter layer of the first conductivity type provided in the semiconductor substrate to define a channel region in the channel layer between the semiconductor substrate and the emitter layer, the emitter layer having an elongate shape extending in parallel with the contact hole and exposed from the contact hole to define a gap from an edge of the contact hole in the specific direction;
a high concentration layer of the second conductivity type disposed in the semiconductor substrate to be connected to the channel layer and to be exposed to the surface portion of the semiconductor substrate in the gap between the edge of the contact hole and the emitter layer, the high concentration layer having a resistance lower than that of the channel layer;
an emitter electrode disposed in the contact hole to contact both the emitter layer and the high concentration layer consitituting the surface portion of the semiconductor substrate;
a gate electrode disposed above the channel region with the insulating film inter posed therebetween; and
a collector electrode for supplying a current to the emitter electrode through the semiconductor substrate, wherein the high concentration layer includes a rectangular first portion having a long side extending in parallel with the contact hole, and a second portion connected to a short side of the first portion at a portion deeper than the channel layer and having a width which increases as a distance from the short side of the first portion increases, the second portion being exposed to the surface portion of the semiconductor substrate in the gap to contact the emitter electrode.

21. The semiconductor device of claim 20, wherein the width of the second portion is larger than a width of the contact hole.

22. An insulated gate type field effect transistor comprising:
- a common semiconductor region of a first conductivity type;
- a plurality of transistor cell regions, each of the transistor cell regions comprising a composite base region of a second conductivity type disposed in a surface of the common semiconductor region, and a surface semiconductor region of the first conductivity type disposed in the composite base region, channels being respectively defined in the transistor cell regions;
- a common gate electrode facing to the respective channels;
- a first electrode commonly connected to the surface semiconductor region in each of the transistor cell regions; and
- a second electrode provided to supply current via the common semiconductor region, wherein the composite base region comprises:
  - a linear channel-well extending along a corresponding channel to encompass the corresponding channel;
  - a linear deep-well extending along the corresponding channel and disposed within the channel-well, and having a higher impurity concentration and a deeper junction depth than those of the channel-well;
  - a spread deep-well having a spread portion spreading in the surface of the common semiconductor region, having a higher impurity concentration and a deeper junction depth than those of the channel-well, the spread deep-well and the linear deep-well contacting at a deeper than the channel-well; and
  - the first electrode contacting the linear deep-well and the spread deep-well.

23. The insulated gate field effect transistor of claim 22, wherein:
- each of the plurality of transistor cell regions has the linear deep-well; and
- the spread deep-well is common to the plurality of transistor cell regions, and is connected to the linear deep-well in each of the plurality of transistor cell regions.

24. The insulated gate type field effect transistor of claim 23, the spread deep-well spreading below both the first electrode and the common gate electrode.

25. The insulated gate field effect transistor of claim 22, wherein the spread deep-well includes first and second spread deep-wells spreading in the surface of the common semiconductor region at both sides of the linear deep-well in a longitudinal direction of the linear deep-well and contacting the linear deep-well at the both sides.

26. The insulated gate type field effect transistor of claim 22, wherein the linear deep-well has a linear contact region having a higher impurity concentration than that of a remaining region of the linear deep-well other than the linear contact region, and contacting the first electrode.

* * * * *